(12) United States Patent
Elizondo et al.

(10) Patent No.: US 9,747,542 B2
(45) Date of Patent: *Aug. 29, 2017

(54) SYSTEMS AND METHODS FOR BREAKAWAY RFID TAGS

(71) Applicant: NEOLOGY, INC., Poway, CA (US)

(72) Inventors: Paul Elizondo, Escondido, CA (US); John Azevedo, San Diego, CA (US)

(73) Assignee: Neology, Inc., Poway, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/356,448

(22) Filed: Nov. 18, 2016

(65) Prior Publication Data

US 2017/0068882 A1    Mar. 9, 2017

Related U.S. Application Data

(63) Continuation of application No. 15/013,939, filed on Feb. 2, 2016, now Pat. No. 9,501,736, which is a
(Continued)

(51) Int. Cl.
*G06K 19/077* (2006.01)
*H04J 3/06* (2006.01)
(Continued)

(52) U.S. Cl.
CPC ..... *G06K 19/07798* (2013.01); *G06K 7/0008* (2013.01); *G06K 7/10029* (2013.01); *G06K 7/10039* (2013.01); *G06K 19/0723* (2013.01); *G06K 19/07796* (2013.01); *G06Q 10/08* (2013.01); *H04J 3/0641* (2013.01); *H05K 1/02* (2013.01); *H05K 1/0266* (2013.01);
(Continued)

(58) Field of Classification Search
USPC .................... 235/492, 488; 340/572.8, 572.7
See application file for complete search history.

(56) References Cited

U.S. PATENT DOCUMENTS 4,660,127 A    4/1987  Gunter
4,935,907 A    6/1990  Friedman
(Continued)

FOREIGN PATENT DOCUMENTS

GB    2328839 A    3/1999
JP    2009250849 A    10/2009
MX    297024    6/2007

OTHER PUBLICATIONS

International Search Report for PCT/US2007071823, mailed Feb. 14, 2008, 1 page.

*Primary Examiner* — Allyson Trail
(74) *Attorney, Agent, or Firm* — Procopio, Cory, Hargreaves & Savitch LLP; Noel C. Gillespie; Daniel K. Robertson

(57) ABSTRACT

A breakaway RFID tag is configured such that it comprises part of a Printed Circuit Board Assembly (PCB). Thus, the breakaway RFID tag can be used to track the PCB as it migrates through a manufacturing process. In one embodiment, the RFID tag can be assembled first and then used to track the PCB as it is populated with components and installed into larger assemblies and ultimately into the end device. Once the PCB is installed into a larger assembly or the end device, the breakaway RFID tag is configured such that it can be broken off and attached to the outside of the larger assembly or end device.

16 Claims, 5 Drawing Sheets

Related U.S. Application Data continuation of application No. 14/636,916, filed on Mar. 3, 2015, now Pat. No. 9,253,876, which is a continuation of application No. 14/108,216, filed on Dec. 16, 2013, now Pat. No. 8,991,714, which is a continuation of application No. 13/449,237, filed on Apr. 17, 2012, now Pat. No. 8,610,580, which is a continuation of application No. 11/766,737, filed on Jun. 21, 2007, now Pat. No. 8,179,265.

(60) Provisional application No. 60/805,423, filed on Jun. 21, 2006.

(51) Int. Cl.
| | |
|---|---|
| *G06K 7/00* | (2006.01) |
| *G06K 19/07* | (2006.01) |
| *G06Q 10/08* | (2012.01) |
| *G06K 7/10* | (2006.01) |
| *H05K 1/02* | (2006.01) |
| *H05K 1/14* | (2006.01) |
| *H05K 3/30* | (2006.01) |

(52) U.S. Cl.
CPC ........... *H05K 1/0268* (2013.01); *H05K 1/142* (2013.01); *H05K 3/30* (2013.01); *H05K 2201/0909* (2013.01); *H05K 2201/09127* (2013.01)

(56) References Cited

U.S. PATENT DOCUMENTS

| | | | |
|---|---|---|---|
| 5,117,746 A | 6/1992 | Sharp | |
| 5,689,238 A | 11/1997 | Cannon et al. | |
| 5,751,220 A | 5/1998 | Ghaffari et al. | |
| 5,942,977 A | 8/1999 | Palmer et al. | |
| 6,060,992 A | 5/2000 | Huang et al. | |
| 6,118,379 A | 9/2000 | Kodukula et al. | |
| 6,259,353 B1 | 7/2001 | Berger et al. | |
| 6,330,971 B1 | 12/2001 | Mabry et al. | |
| 6,424,260 B2 | 7/2002 | Maloney | |
| 6,538,564 B1 | 3/2003 | Cole | |
| 6,563,425 B2 | 5/2003 | Nicholson et al. | |
| 6,643,801 B1 | 11/2003 | Jammu et al. | |
| 6,720,930 B2 | 4/2004 | Johnson et al. | |
| 6,724,308 B2 | 4/2004 | Nicholson | |
| 6,750,771 B1 | 6/2004 | Brand | |
| 6,812,838 B1 | 11/2004 | Maloney | |
| 6,983,033 B1 | 1/2006 | Jenkins | |
| 6,989,796 B2 | 1/2006 | Rahim | |
| 7,075,435 B2 | 7/2006 | Jesser | |
| 7,129,840 B2 | 10/2006 | Hull et al. | |
| 7,176,799 B1 | 2/2007 | Golicz et al. | |
| 7,183,922 B2 | 2/2007 | Mendolia et al. | |
| 7,295,120 B2 | 11/2007 | Waldner et al. | |
| 7,336,174 B1 | 2/2008 | Maloney | |
| 7,339,120 B2 | 3/2008 | Notohara et al. | |
| 7,342,499 B2 | 3/2008 | Chiu et al. | |
| 7,391,325 B2 | 6/2008 | Cobianu et al. | |
| 7,432,816 B1 | 10/2008 | Ku et al. | |
| 7,701,351 B2 | 4/2010 | Kawai et al. | |
| 7,884,725 B2 | 2/2011 | Kruest et al. | |
| 7,893,833 B2 | 2/2011 | Shachar | |
| 7,969,282 B2 | 6/2011 | Powell et al. | |
| 8,072,326 B2 | 12/2011 | Cotton | |
| 8,098,134 B2 | 1/2012 | Azevedo et al. | |
| 8,179,265 B2 | 5/2012 | Elizondo et al. | |
| 8,451,095 B2 | 5/2013 | Azevedo et al. | |
| 8,610,580 B2 | 12/2013 | Elizondo et al. | |
| 2002/0048462 A1 | 4/2002 | Weinberger et al. | |
| 2002/0109636 A1 | 8/2002 | Johnson et al. | |
| 2002/0123251 A1 | 9/2002 | Yatskov et al. | |
| 2002/0196126 A1 | 12/2002 | Eisenberg et al. | |
| 2004/0046663 A1 | 3/2004 | Jesser | |
| 2004/0070953 A1 | 4/2004 | Schulz et al. | |
| 2004/0085192 A1 | 5/2004 | Hartmann | |
| 2004/0150521 A1 | 8/2004 | Stilp | |
| 2004/0212542 A1 | 10/2004 | Rahim | |
| 2005/0077353 A1 | 4/2005 | Oishi et al. | |
| 2005/0110641 A1 | 5/2005 | Mendolia et al. | |
| 2005/0186902 A1 | 8/2005 | Lieffort et al. | |
| 2005/0242953 A1 | 11/2005 | Nakagawa et al. | |
| 2005/0248455 A1 | 11/2005 | Pope et al. | |
| 2006/0001585 A1 | 1/2006 | Saito et al. | |
| 2006/0012465 A1 | 1/2006 | Lee | |
| 2006/0055539 A1 | 3/2006 | Lawrence et al. | |
| 2006/0081333 A1 | 4/2006 | Hohberger et al. | |
| 2006/0145864 A1 | 7/2006 | Jacober et al. | |
| 2006/0158311 A1 | 7/2006 | Hall et al. | |
| 2006/0176152 A1 | 8/2006 | Wagner et al. | |
| 2006/0223340 A1 | 10/2006 | Yoneda | |
| 2007/0000989 A1 | 1/2007 | Kadaba | |
| 2007/0096911 A1 | 5/2007 | Gualtieri | |
| 2007/0171071 A1 | 7/2007 | Chiu et al. | |
| 2007/0171078 A1 | 7/2007 | Cotton | |
| 2007/0173970 A1 | 7/2007 | Shachar | |
| 2007/0279233 A1 | 12/2007 | Ryckman | |
| 2008/0024273 A1 | 1/2008 | Kruest et al. | |
| 2008/0055094 A1 | 3/2008 | Barber et al. | |
| 2008/0315992 A1 | 12/2008 | Forster | |
| 2009/0079568 A1 | 3/2009 | Forster et al. | |
| 2011/0050426 A1 | 3/2011 | Choong | |
| 2011/0133899 A1 | 6/2011 | Shachar | |
| 2011/0163849 A1 | 7/2011 | Kruest et al. | |

SYSTEMS AND METHODS FOR BREAKAWAY RFID TAGS

RELATED APPLICATIONS INFORMATION

This present application is a continuation of U.S. patent application Ser. No. 15/013,939, filed on Feb. 2, 2016, which claims the benefit of priority as a Continuation under 35 U.S.C. §120 of U.S. patent application Ser. No. 14/636,916, filed on Mar. 3, 2015, which claims the benefit of priority as a Continuation under 35 U.S.C. §120 of U.S. patent application Ser. No. 14/108,216, filed on Dec. 16, 2013, which claims the benefit of priority as a Continuation under 35 U.S.C. §120 of U.S. patent application Ser. No. 13/449,237, filed on Apr. 17, 2012, which claims the benefit of priority as a Continuation under 35 U.S.C. §120 of U.S. patent application Ser. No. 11/766,737, filed Jun. 21, 2007, entitled "Systems and Methods for Breakaway RFID Tags," which in turn claims the benefit of priority under 35 U.S.C. 119(e) to Provisional Patent Application Ser. No. 60/805,423, entitled "An RFID Smart Cabinet and a Multi-Document Read Write Station," filed Jun. 21, 2006, all of which are incorporated herein by reference as if set forth in full.

BACKGROUND

1. Field of the Invention

The field of the invention relates generally to Radio Frequency Identification (RFID) systems and more particularly to the design and construction of RFID tags used for tracking the assembly of various devices.

2. Background of the Invention

In complex manufacturing processes, such as the manufacturing of consumer electronics, hundreds or even thousands of parts are assembled to make a single device. It is important to track these components as they go through the manufacturing process. Often logs are used to track components using some form of serial number as they go through the manufacturing process; however, as smaller components get assembled into larger components and ultimately into the end device it can be difficult to continue tracking such components. Moreover, current logging systems can be disparate and difficult to correlate information associated with a specific component.

In certain situations, bar codes or other technology can be used to assist in tracking components as they are assembled in the manufacturing process. Thus, as a component comes to a new station from the manufacturing process it can be scanned, e.g., using a bar code scanner, and information related to the component can be tracked in an electronic database. RFID technology has the added advantage in that line of sight is not required to effectively scan an RFID tag being used to track a component. Even with RFID technology, however, it can be difficult to continue tracking components as they are assembled in the larger assembles because even though line of sight is not required, other components and circuitry can interfere with the ability to effectively read an RFID tag once a component associated with the tag has been assembled into a larger device.

The inability to efficiently track components up to the device level hinders the ability to efficiently track information that can used to spot trends, such as the failure trends, to assist in servicing failed devices, and in keeping efficient inventory records.

SUMMARY

A breakaway RFID tag is configured such that it comprises part of a Printed Circuit Board Assembly (PCB). Thus, the breakaway RFID tag can be used to track the PCB as it migrates through a manufacturing process. In one embodiment, the RFID tag can be assembled first and then used to track the PCB as it is populated with components and installed into larger assemblies and ultimately into the end device. Once the PCB is installed into a larger assembly or the end device, the breakaway RFID tag is configured such that it can be broken off and attached to the outside of the larger assembly or end device. In this manner, the RFID tag can be used to continue tracking the PCB all the way through the end of the manufacturing process. Accordingly, tracking information can be more efficiently correlated and used to improve inventory tracking, failure trend spotting analysis, and to improve service by providing information that can quickly identify potential problems in a failed field unit.

These and other features, aspects, and embodiments of the invention are described below in the section entitled "Detailed Description."

BRIEF DESCRIPTION OF THE DRAWINGS

Features, aspects, and embodiments of the inventions are described in conjunction with the accompanying drawings, in which.

DETAILED DESCRIPTION

Figure 1:
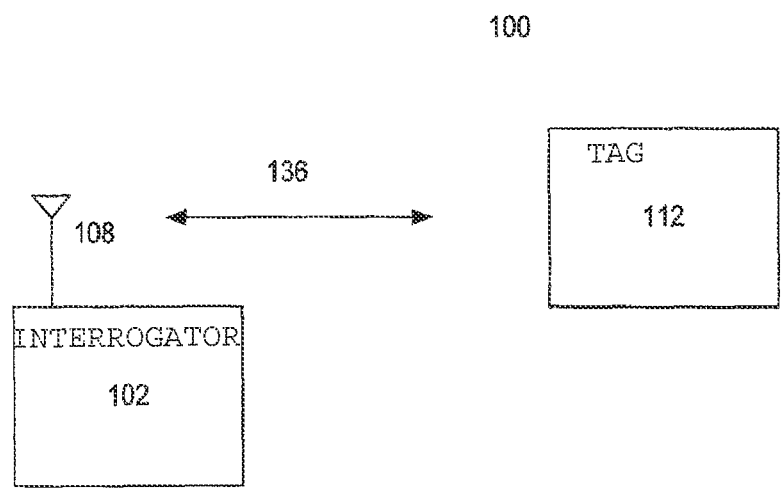
FIG. 1 is a diagram illustrating an exemplary RFID system.

FIG. 1 is a diagram illustrating an exemplary RFID system 100. As can be seen RFID system 100 comprises an RFID interrogator 102, an antenna or a coil 108, and a transponder, or RFID tag 112. RFID interrogator 102 communicates with RFID tag 112 over an RF communication channel 136. RFID tag 112 can be passive or active. In the active case, RFID tag 112 can comprise its own power source, which can allow it to store more information. In the passive case, RFID tag 112 uses the energy in the signal received over RF channel 136 to power up a small transponder circuit. The transponder circuit is configured to read the instructions transmitted by RFID interrogator over RF channel 136 and respond accordingly. Often, the instructions received from RFID interrogator 102 require the transponder circuit to read a small amount of information stored in a memory circuit on RFID tag 112 and transmit the information back to RFID interrogator 102 over RF channel 136. The passive RFID tag 112 typically does not generate an RF signal to be transmitted over RF channel 136. Rather, RFID tag 112 simply reflects the received RF signal, while encoding the data retrieved from memory onto the reflected signal.

Thus, a passive RFID tag comprises a coil, or some form of antenna, and a transponder circuit. A transponder circuit can also include memory circuits for use as described above. The coil or antenna can comprise traces deposited onto a substrate in the same way that traces are deposited onto a PCB substrate. Accordingly, an RFID tag can be manufactured using a PCB substrate with printed traces forming the antenna or coil as well as pads configured to receive a transponder IC. In the systems and methods described below, the ability to make an RFID tag using a PCB substrate and traces is taken advantage of to track the PCB state assembly process by manufacturing the PCBs with a breakaway RFID tag that can be used to track the PCB as components are populated thereon and as the PCB is assembled into larger component assemblies and/or into the end device.

Figure 2:
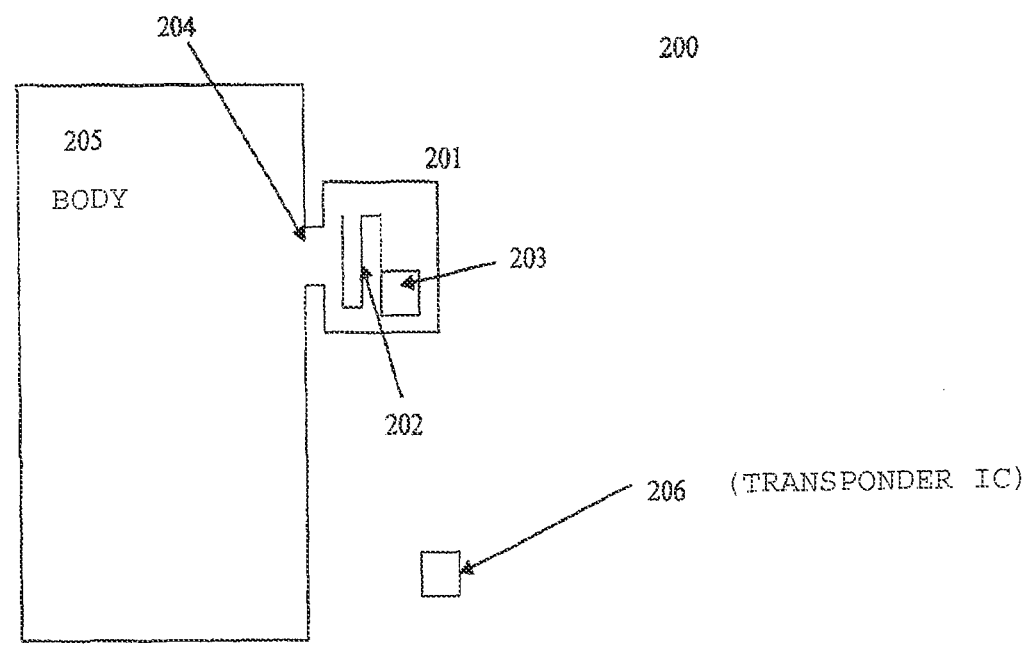
FIG. 2 is a diagram illustrating an example printed circuit board comprising a breakaway RFID tag in accordance with one embodiment of the inventor.

FIG. 2 is a diagram illustrating an example Printed Circuit Board (PCB) 200 comprising a breakaway RFID tag 201 connected to main body 205 by a breakaway connection 204 in accordance with one embodiment of the invention. Main body 205 can comprise traces for interconnecting other components that are essential to the functioning of the assembled PCB 200. Breakaway RFID tag 200 can comprise a printed antenna 202 and an integrated circuit (IC) pad 203. IC pad 203 can be configured to receive an RFID transponder IC 206. Thus, IC pad 203 can be of several types, depending on the processes and technology used for a particular implementation. For example, IC pad 206 can comprise a surface mount pad or a dual axial lead pad, just to name a couple.

Accordingly, breakaway RFID tag 201 can be populated, e.g., with transponder IC 206, before main body 205 is populated with any associated components. A breakaway RFID tag can then be used to begin tracking information related to the assembly of main body portion 205 until main body portion 205 is to be assembled into a larger component assembly. The breakaway RFID tag can then be broken away from main body portion 205 by breaking breakaway connection 204. The breakaway connection 204 can then used to continue tracking the component assembly into which main body portion 205 was assembled. Thus, breakaway connection 204 can simply comprise a narrow portion of PCB substrate that can be snapped off when required. Alternatively, breakaway connection 204 can comprise a PCB substrate that is perforated with holes in order to make it easier to snap off and break away RFID tag 101. In other embodiments, breakaway connection 204 can be configured such that it can be cut, i.e., using a knife, scissors, or the like, or even sawed in order to disconnect breakaway RFID tag 201 from main body portion 205.

Figure 3:
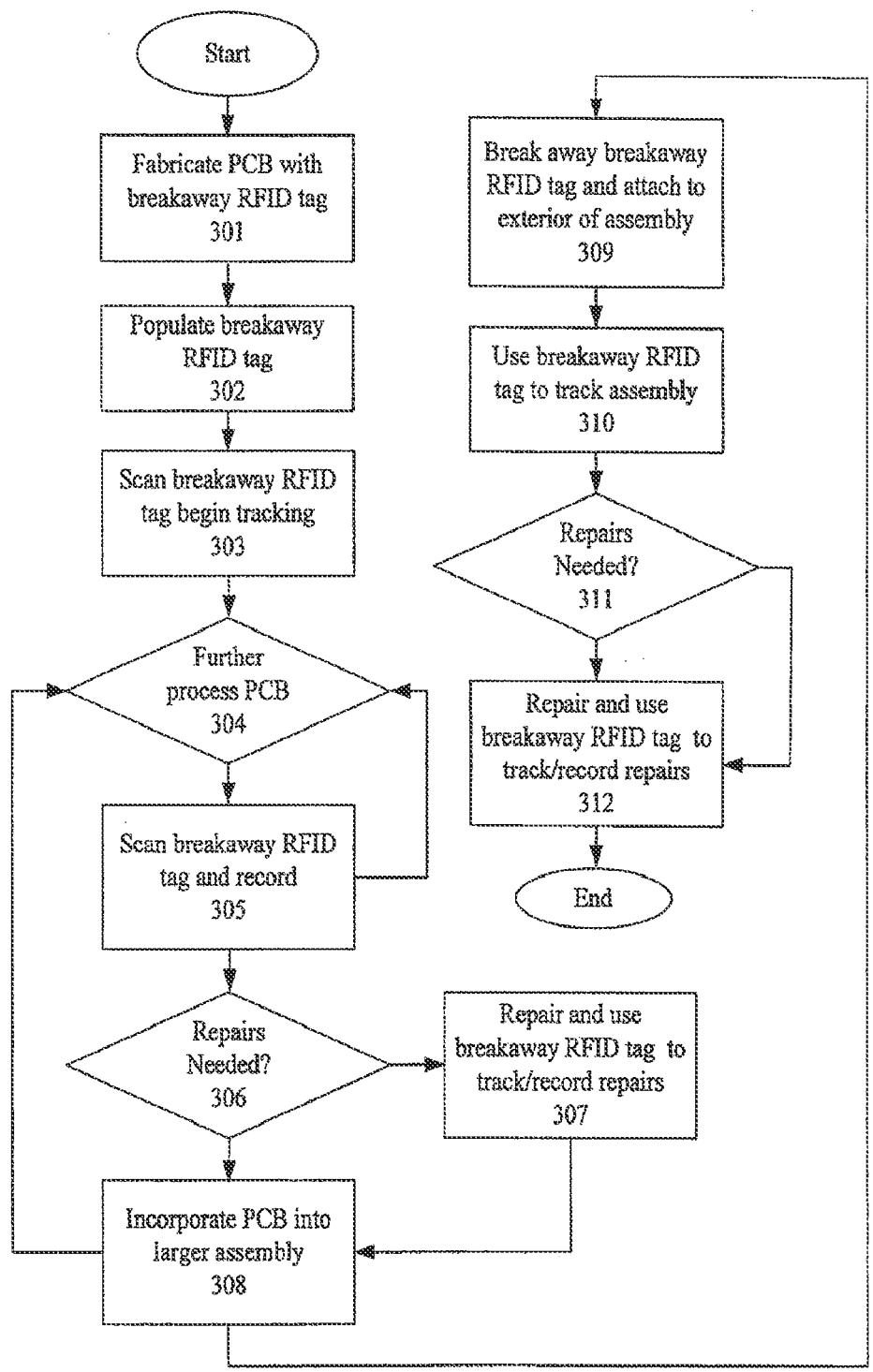
FIG. 3 is a diagram illustrating an example method for tracking an assembly process using the breakaway RFID tag of FIG. 2 in accordance with one embodiment of the invention.

FIG. 3 is a flowchart illustrating an example method for tracking an assembly process using, e.g., breakaway RFID tag 201 in accordance with one embodiment of the systems and methods described herein. First, in step 301, a PCB 200 comprising main body portion 205, breakaway connection 204, and breakaway RFID tag 201 is fabricated using known fabrication techniques. Again, breakaway RFID tag 201 should at least include a printed coil, or antenna, 202 and an IC pad 203. IC pad 203 can be of several types, e.g., including a surface mount pad or a dual axial lead pad. Main body portion 205 can contain pads and interconnects for assembling and connecting other components.

After fabricating PCB 200 with breakaway tag 201, IC pad 203 can be populated with an RFID transponder IC 206 in step 302. RFID transponder IC 206 can be populated onto breakaway RFID tag 201 using a number of different methods, including surface mounting or dual axial lead mounting, depending on the type of transponder IC 206 and IC pad 203. Once RFID transponder 206 has been assembled onto breakaway RFID tag 201, RFID tag 201 can be scanned to record any associated identification information in step 303. The recorded identification information can, for example, be used for tracking or troubleshooting as will be described below. In addition to the identification information, other information such as the time, can be recorded as well.

In certain embodiments, PCB 200 can then be assembled into a larger assembly without any further processing, as illustrated in step 208. Once PCB 200 is assembled into a larger assembly, breakaway RFID tag 201 can be detached from main body portion 205 and attached to the exterior surface of the assembly, as illustrated in step 309. As mentioned above, placing breakaway RFID tag 201 on the exterior surface of the assembly allows breakaway RFID tag 201 to continue performing its tracking function once main body portion 205 has been incorporated within the assembly. Thus, breakaway RFID tag 201 can be used to track the assembly into which main body portion 205 has been assembled. Tracking can be performed simply by scanning, in step 310, breakaway RFID tag 201 and recording its identifying information. In addition to the identifying information for each breakaway RFID tag 201, it is possible to record other information such as the time of the scan.

PCB 200 can, however, be subject to further assembly processes before it is incorporated into a larger assembly in step 308. For example, main body portion 205 can be populated with other components in multiple processing steps, as illustrated in step 304. After each additional processing step 304, breakaway RFID tag 201, which can still be attached to main body portion 205, can be scanned and recorded in step 305. The additional processing performed on the PCB 204 may consist of many smaller steps. Thus, several additional processing steps 304 are required, breakaway RFID tag 301 can be scanned and information recorded after each step.

Breakaway RFID tag 201 can also be used to track and/or record when repairs, or abnormal processing steps, occur in relation to main body portion 205. Thus, if it is determined, in step 306, that repairs are needed, then PCB 200 can be routed to a repair station. Breakaway RFID tag can be used to track the occurrence of the repair, e.g., scanning, in step 307, breakaway RFID tag 201 as PCB 200 enters and/or exits the repair station to record the identifying information of breakaway RFID tag 201 and, optionally, additional information.

As should be apparent, scanning RFID tag 201 at various steps in the assembly process can enable the creation of a database of information related to the assembly process for a particular PCB 200. RFID tag 201 will often be a passive RFID tag and therefore comprise a limited amount of information. Accordingly, RFID tag 201 will often be used to store little more than an identifier associated with PCB 200; however, by integrating the RFID scanners used to scan information from RFID tags 201 with a larger tracking system, assembly operators can provide detailed information for each PCB 200 and associated with the identifier scanned from the associated RFID tag 201. For example, if a PCB 200 enters a repair station, then the associated breakaway RFID tag 201 can be scanned and then information related to the repairs can be entered, e.g., through a computer. A scanned identifier and related information can then be stored into a database for later retrieval and use. One such use, would be in servicing a failed unit that has been fielded, i.e., sold to a consumer or end user. This is described in more detail below.

Similarly, breakaway RFID tag 201 can be used to track and/or record repairs to the assembly after breakaway RFID tag 201 has been attached to the exterior of the assembly in step 309, as illustrated by step 310. Thus, if it is determined in step 311 that repairs are needed, then they can be made and then those repairs traced using breakaway RFID tags 201. This can be done by scanning breakaway RFID tag 201 as the assembly enters and/or exits the repair station to record the identifying information of breakaway RFID tag 201 and, optionally, additional information in step 312.

Figure 4:
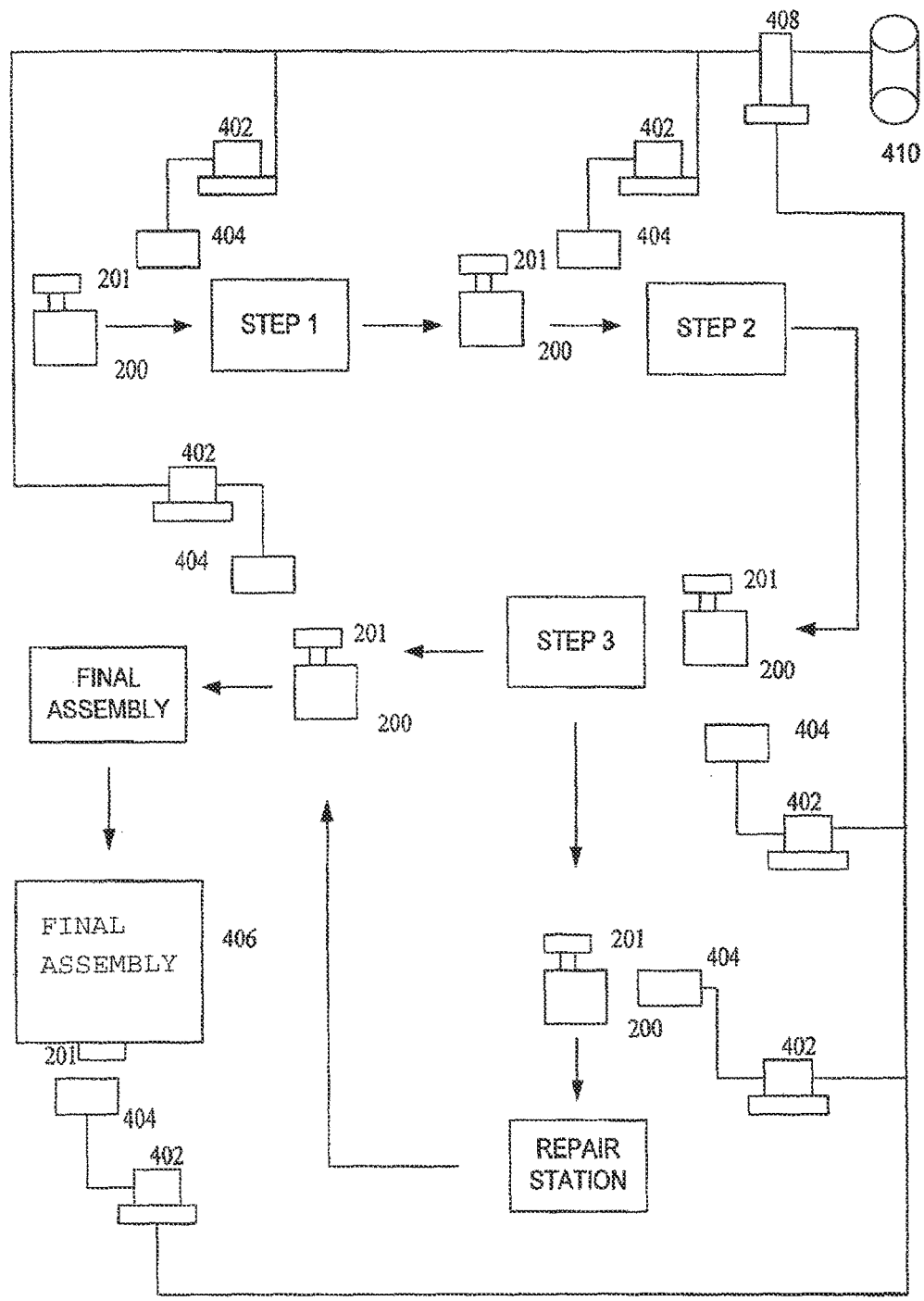
FIG. 4 is a diagram illustrating an example of assembly process for the printed circuit board of FIG. 2; and, FIG. 5 is a diagram illustrating a method of troubleshooting an assembly process using information retrieved from the breakaway RFID tag of FIG. 2.

FIG. 4 to the diagram is illustrating an example assembly process for a PCB 200 comprising a breakaway RFID tag 201 in accordance with one embodiment of the systems and methods described herein. Thus, as can be seen, the assembly process comprises three assembly steps, step 1, step 2, and step 3, performed at the PCB level. As PCB 200 enters assembly step 1, RFID tag 201 can be scanned by an RFID scanner 404. Similarly, as PCB 200 enters step 2 and step 3, RFID tag 201 can again be scanned by an RFID scanner 404. Depending on the embodiment, RFID tag 201 can also be scanned by an RFID scanner 404 as it exits one or more of assembly steps 1, 2 and 3.

In addition, RFID scanners 404 can be interfaced with computer stations 402. Computer stations 402 can be used to input information related to the assembly of PCB 200. Any such information, can be associated with information scanned from the associated RFID tag 201. Computer stations 402 can then be interfaced with a central server 408 so that the scanned information, and any information input through a computer terminal 402 can be stored in a database 410 interfaced with or included in central server 408.

Depending on the embodiment, or on the step in the assembly process, little more than the identifying information, and possibly a time step, can be noted in order to attract the assembly of PCB 200; however, if there is a problem in the assembly of PCB 200, then it is often necessary to record additional information so that details related to the problem can be stored in database 410. For example, as illustrated in FIG. 4, PCB 200 may need to enter a repair station during the assembly process. Thus, RFID tag 201 can be scanned as it enters the repair station and information related to the nature of the repairs can be entered through computer terminal 402 and stored in database 410.

Once PCB 200 has passed through assembly steps 1, 2, and 3, and possibly the repair station, it can be assembled into a larger component assembly in the final assembly step for PCB 200. At this point, breakaway RFID tag 201 can be broken off, or otherwise detached from PCB 200, and attached to the outside of the final assembly 406. RFID tag 201 can then be used to track final assembly 406. Such tracking can include, for example, tracking information related to any repairs made on final assembly 406 as described above.

It should be noted, that in certain embodiments of RFID scanner 404, RFID scanner 404 can include a computer system. Thus, computer terminal 402 may not be needed in order to interface RFID scanner 404 with central server 408. Alternatively, even if RFID scanner 404 includes a computer system, then it can still be interfaced with a computer terminal 402 if required by a particular implementation.

Figure 5:
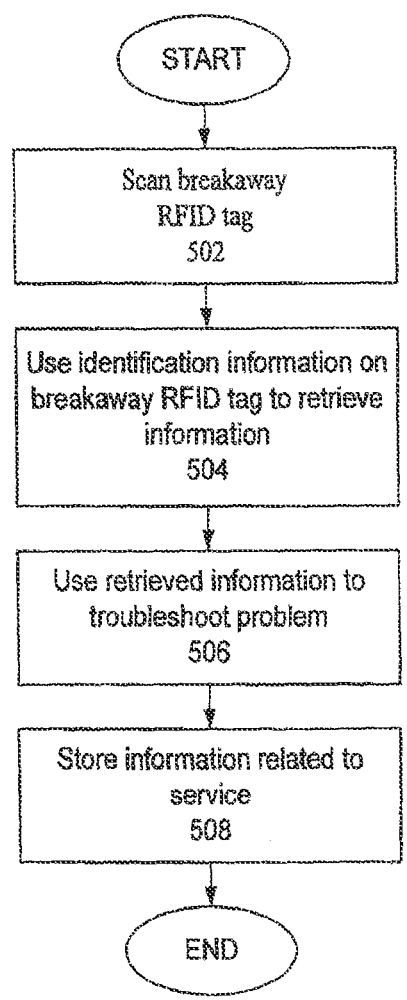

Once RFID tag 201 is attached to the outside of assembly 406, it can remain there and be used even after assembly 406 has been fielded, e.g., sold to a consumer. FIG. 5 is a flowchart illustrating an example method for using RFID tag 201 in order to troubleshoot failures in fielded units in accordance with one embodiment of the systems and methods described herein. Thus, for example, if a unit in the field fails, a technician can be dispatched in order to service the unit. The technician can begin servicing the unit by scanning breakaway RFID tag 201, in step 502, attached to the outside of the unit. In step 504, the information scanned can then be used to access information related to the assembly of the unit. In other words, information stored in database 410 can be accessed and used to identify potential problems with the fielded unit. Thus, in step 506, information obtained using the scanned information from RFID tag 201 can be used to troubleshoot potential problems with the fielded unit. In particular, if PCB 200 went through a repair station, information related to the repairs can be accessed and analyzed to determine if it is likely that the repairs were insufficient.

Moreover, as the technician troubleshoots and services the fielded unit, information related to the servicing can be associated with the information scanned from RFID tag 201 and then stored, e.g., in database 410. Thus, in step 508, information can be tracked and stored over the lifetime of assembly 406. The information tracked and stored can, however, easily be correlated and stored for efficient retrieval and use over the lifetime of assembly 406.

The information related to servicing of fielded units can be used, for example, to track failure trends and identify problems in the assembly process. For example, if servicing of a plurality of fielded units reveals that the problem is consistently related to portions of PCB 200 that went through a repair station, then this information could be used to ascertain that the repair processes associated with the repair station are inadequate, or are not being implemented correctly. Similarly, information related to consistent failures in the field can be used to identify problems in the assembly process that are not being detected. This information can then be used to implement processes to identify such problems and to implement repair stations to correct the problems when they are identified.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A trackable printed circuit board (PCB), comprising:
a main circuit area which is manufactured through a PCB process including a plurality of processing steps;
a breakaway radio frequency identification (RFID) tag disposed on the PCB, the breakaway RFID tag comprising a printed antenna and an integrated circuit (IC) pad configured to receive a RFID transponder IC, wherein the plurality of processing steps include a repair step for performing a repair operation on the trackable PCB at a repair station; and
a breakable portion connecting the main circuit area and the RFID tag, wherein the breakable portion is configured to allow the breakaway RFID tag to be detached from the main circuit area.

2. The trackable PCB of claim 1, wherein the breakaway RFID tag is scanned before each of the plurality of processing steps.

3. The trackable PCB of claim 1, wherein the breakaway RFID tag is scanned after each of the plurality of processing steps.

4. The trackable PCB of claim 1, wherein the plurality of processing steps include one or more assembly steps for assembling multiple components onto the main circuit area.

5. The trackable PCB of claim 1, wherein the breakaway RFID tag is configured to be scanned during the PCB process when the breakaway RFID tag is attached to the main circuit area and store information associated with the plurality of processing steps.

6. The trackable PCB of claim 5, wherein the breakaway RFID tag is scanned when the trackable PCB enters the repair station.

7. The trackable PCB of claim 5, wherein the breakaway RFID tag is scanned when the trackable PCB exits the repair station.

8. The trackable PCB of claim 1, wherein the stored information includes identification information of the breakaway RFID tag and a time when the breakaway RFID tag is scanned.

9. The trackable PCB of claim 1, wherein the breakaway RFID tag is configured to be detached from the main circuit area and attached to an exterior of an assembly comprising the PCB.

10. The trackable PCB of claim 1, wherein the breakaway RFID tag further comprises an RFID transponder disposed on the IC pad.

11. The trackable PCB of claim 1, wherein the breakable portion is perforated with holes so that the breakaway RFID tag can be snapped-off from the trackable PCB.

12. The trackable PCB of claim 1, wherein the breakaway RFID tag comprises a passive RFID tag.

13. The trackable PCB of claim 1, wherein the breakaway RFID tag comprises an active RFID tag.

14. The trackable PCB of claim 1, wherein the printed antenna and IC pad are disposed on the breakable portion.

15. The trackable PCB of claim 1, wherein the breakaway RFID tag is configured to store tracking information associated with the plurality of processing steps.

16. The trackable PCB of claim 1, wherein the breakaway RFID tag is configured to store repair information of the repair operation performed on the trackable PCB at the repair station.

* * * * *